United States Patent [19]
Nishioka et al.

[11] Patent Number: 5,814,888
[45] Date of Patent: Sep. 29, 1998

[54] SEMICONDUCTOR DEVICE HAVING A MULTILAYER WIRING AND THE METHOD FOR FABRICATING THE DEVICE

[75] Inventors: Yasushiro Nishioka; Tsuyoshi Tanaka; Kyung-ho Park; Yasutoshi Okuno, all of Ibaraki, Japan

[73] Assignee: Texas Instruments Incorporated, Dallas, Tex.

[21] Appl. No.: 821,489

[22] Filed: Mar. 21, 1997

Related U.S. Application Data

[63] Continuation of Ser. No. 461,460, Jun. 5, 1995, abandoned.

[30] Foreign Application Priority Data

Jun. 6, 1994  [JP]  Japan ..................................... 6-123871

[51] Int. Cl.[6] ........................... H01L 23/48; H01L 23/52; H01L 29/40; H01L 29/00
[52] U.S. Cl. ......................... 257/758; 257/503; 257/522; 257/773
[58] Field of Search ..................................... 257/758, 773, 257/522, 503

[56] References Cited

FOREIGN PATENT DOCUMENTS 0286146  3/1990  Japan ...................................... 257/758

*Primary Examiner*—T. M. Arroyo
*Attorney, Agent, or Firm*—Gerald E. Laws; William B. Kempler; Richard L. Donaldson

[57] ABSTRACT

A semiconductor device with a multilayer wiring structure has an insulating substrate and first conductors formed on top of the insulating substrate with a groove between neighboring first conductors. An insulating film covers the first conductors as well as the grooves between the neighboring first conductors. A void serving to reduce electrostatic capacitance between the conductors is formed in the grooves. An interlayer insulating film is formed on top of the first conductors to prevent leakage current, and second conductors are formed on top of the interlayer insulating film.

18 Claims, 3 Drawing Sheets

SEMICONDUCTOR DEVICE HAVING A MULTILAYER WIRING AND THE METHOD FOR FABRICATING THE DEVICE

This application is a continuation of application Ser. No. 08/461,460, filed Jun. 5, 1995, now abandoned.

FIELD OF THE INVENTION

The present invention pertains to semiconductor devices and a method for fabricating them. More particularly, it relates to making semiconductor devices that contain multilayer wiring with a low electrostatic capacitance between the wires.

In addition, it pertains to a technology that is effective when applied to DRAMs that are adversely affected by leakage current.

BACKGROUND OF THE INVENTION

FIG. 14 illustrates a typical example of conventional metal wiring. On top of a monocrystalline silicon substrate 21, a silicon oxide film 22 is formed, after which a lower-layer metal wiring 20 is patterned thereon. Next interlayer insulating films 23 and 25 are formed, and a flattened SOG film 24 is formed. Next an upper metal layer 26 is formed. Advances in reducing the pitch of the multilayer wiring have been achieved as the level of integration in conventional semiconductor devices has increased. Japanese Laid Open Patent Appln. 218,028/93 is an example of a publication related to multilayer wiring.

In many conventional multilayer wiring structures of this type, the specific dielectric constant of the silicon oxide film 23 is approximately 4. Therefore, in recent semiconductor devices in which the line gap of the lower-layer metal wiring 20 is reduced to 1 µm or less because of increased integration, this [the specific dielectric constant] is beginning to have adverse effects on the electrical characteristics of the semiconductor device such as reduced circuit operating speed.

In order to avoid reducing the transmission speed for electric signals, the permitted gap between specified wires, the permitted threshold voltage range for MOS transistors, etc., are reduced. This has the effect of creating fixed limits on the semiconductor integrated circuit fabrication process.

An objective of the present invention is to provide a technology with which it is possible to increase the operating speed of semiconductor integrated circuit devices.

Another objective of the present invention is to provide a technology with which it is possible to reduce constraints on the fabrication process for semiconductor integrated circuit devices.

The new structure and effects of the present invention should be clarified by the text of the Specifications and the attached figures.

SUMMARY OF INVENTION

A general overview of representative examples pertaining to the inventions disclosed in this application is presented below.

With the semiconductor devices of the present invention, an insulating film is coated onto metal wires formed to a fine pitch, as well as onto the grooves between them. Next a void with an extremely low specific dielectric constant of approximately 1 is formed on the grooves. Next an interlayer insulating film is formed to cover the void. This reduces the electrostatic capacitance between the metal wires, and also reduces the leakage current between the wires. More specifically, in the semiconductor device wiring step, fine-pitch metal wires are formed, after which the metal wires and the grooves between the wires are coated with a polyimide base insulating film. During a step in which CVD or sputtering is used to form the insulating film on the grooves, the void is formed between the neighboring metal wires. If the specific dielectric constant of the insulating film is lower than the specific dielectric constant of the silicon oxide film, then the electrostatic capacitance between the metal wires can be reduced even further. In addition, it is also possible to reduce the electrostatic capacitance related to the upper-layer metal wires.

With the invention described above, a void with a low specific dielectric constant is formed on the grooves between neighboring wires, and the metal wires and grooves are coated with an insulating film. This makes it possible to reduce the wiring capacitance between metal wires patterned onto the same layer, and to reduce the leakage current as well.

As a result, it is possible to reduce the time required to charge or discharge the metal wires by means of electric signals in comparison with the conventional case. In addition, it is also possible to reduce the leakage current. Thus it is possible to increase the electric signal transmission speed and to reduce power consumption as well.

Also in the figures, 1 is an insulating film substrate, 2 are first-level metal wires, 3 is a void, 4 are second-level metal wires, 5 is an interlayer insulating film, 6 is an insulating film deposited by sputtering or CVD, 8 is an insulating film deposited by CVD, 20 are lower-layer metal wires, 21 is a monocrystalline silicon substrate, 22, 25 are silicon oxide layers, 24 is an SOG film, and 26 are upper-layer metal wires.

DESCRIPTION OF EMBODIMENTS

Figure 1:
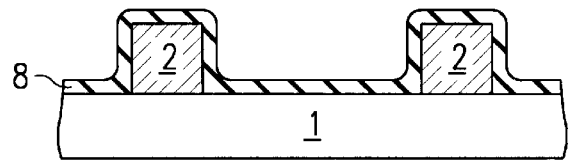
FIG. 1 is a cross section in which the semiconductor device metal wiring of the first embodiment of the present invention is coated with an insulating film.
Figure 2:
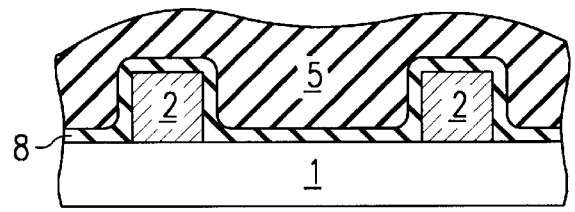
FIG. 2 is a cross section in which the interlayer insulating film of the first embodiment of the present invention is formed.
Figure 3:
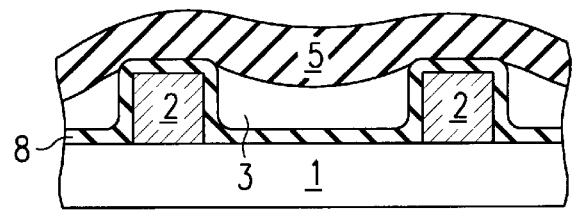
FIG. 3 is a cross section of the void between the wires in the first embodiment of the present invention.
Figure 4:
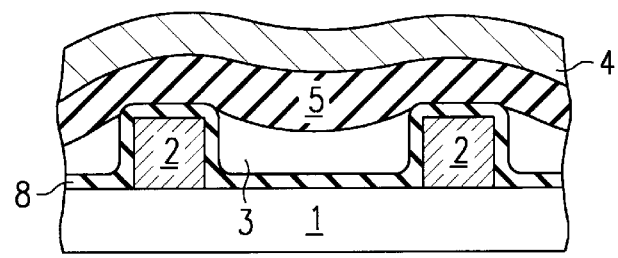
FIG. 4 is a cross section of the major components of the semiconductor devices of the first embodiment of the present invention.

FIG. 1 is a cross section of the first step in a method for fabricating semiconductor devices which is the first embodiment of the present invention. In the structure illustrated, metal wires 2 are formed and patterned onto a insulating film substrate 1. FIG. 2 illustrates a structure obtained using CVD to form a silicon oxide film 8 on the surface of the insulating film substrate 1 and the patterned wires 2. FIG. 3 illustrates the cross section of the structure subsequently obtained when a spinner is used to coat the entire surface of the substrate with a thermally contractive polyimide precursor at an angular velocity of 1000 to 5000 rpm. Next the polyimide on the substrate is baked at 100° to 150° C., causing the solvent to evaporate. Next the polyimide is imidized at 200° to 250° C., then subjected to a final cure at 300° to 400° C. to stabilize the film 5. Because the thermally contractive polyimide contracts, a void 3 is formed automatically in the grooves between the wires. The void has a specific dielectric constant of approximately 1, making it possible to reduce the wiring capacitance. FIG. 4 illustrates the structure obtained when contact holes not shown serving to connect the upper and lower wires are formed on the interlayer insulating film 5, after which upper metal wires 4 are formed. It should be noted that in addition to metal, the wires may consist of polycrystalline silicon, silicide metal, and other conductive materials.

In addition, it is also possible to reduce the wiring capacitance between the lower-layer metal wires 2 and the upper-layer metal wires 4 by using a thermally contractive polyimide material that has a low specific dielectric constant. In addition, because the lower-layer metal wires and grooves are coated with silicon oxide it is possible to reduce the leakage current between the wires. In the dynamic memory (DRAM) field in particular, it is possible to set the leakage current between wires to approximately $10^{-5}$ A/cm$^2$ by controlling the thickness of the silicon oxide film 8 formed through CVD. This leakage current [value] satisfies DRAM specifications and reliability requirements.

In addition, in another embodiment of the present invention, an SOG film is used instead of polyimide as the interlayer insulating film 5. In this embodiment the SOG film should be subjected to a final curing at 350° to 450° C. so that it thermally contracts after it is baked at 100° to 200° C. varying according to the solvent boiling point. In this manner it is possible to form the same type of void as in the previous embodiment.

Figure 5:
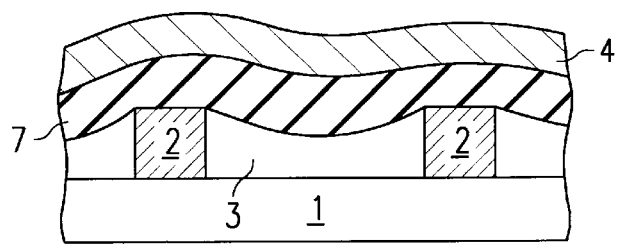
FIG. 5 is a cross section of the major components of the semiconductor devices of another embodiment of the present invention.

In yet another embodiment of the present invention, instead of using a polyimide as the interlayer insulating film 5, the substrate is coated using a spinner with a solvent containing thermally contractive polytetrafluoroethylene (PTFE) 7. FIG. 5 illustrates a structure obtained by baking the PTFE film at 100° to 200° C. varying according to the solvent boiling point, then subjecting it to a final curing at 300° to 400° C. so that it thermally contracts, thereby forming the same type of void as in the previous embodiment. With PTFE the reduction in wiring capacitance is much greater than with the polyimide film or SOG film.

Figure 6:
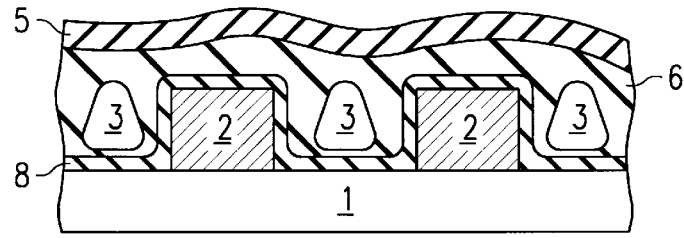
FIG. 6 is a cross section of the major components of the semiconductor devices of another embodiment of the present invention.
Figure 7:
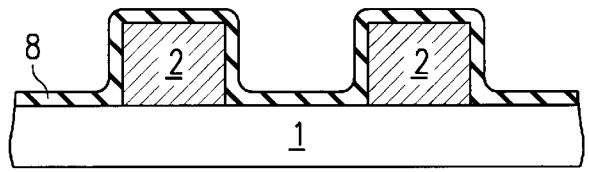
FIG. 7 is a cross section of the metal wiring of another embodiment of the present invention.
Figure 8:
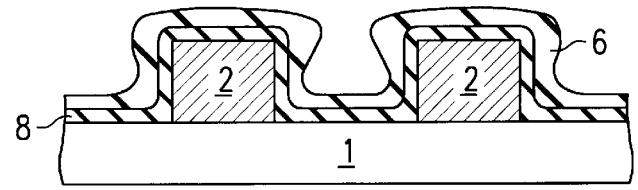
FIG. 8 is a cross section of a step involving CVD in another embodiment of the present invention.
Figure 9:
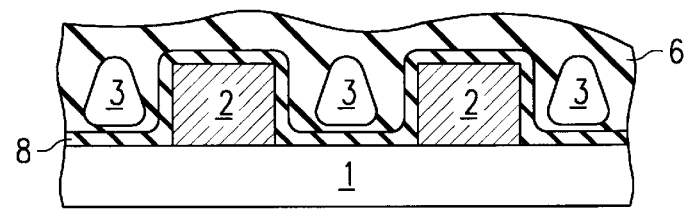
FIG. 9 is a cross section of a void formed by CVD in another embodiment of the present invention.
Figure 10:
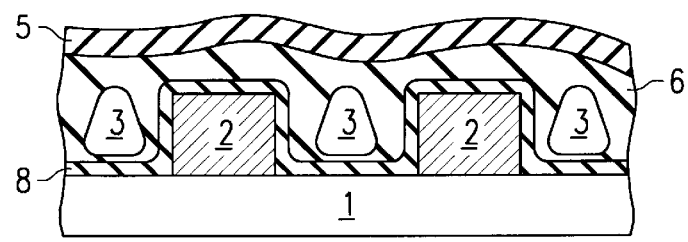
FIG. 10 is a cross section of the major components of the semiconductor devices of another embodiment of the present invention.

FIG. 6 illustrates another embodiment of the present invention. The embodiments described above involve technologies that pertain to the formation of a void with a low dielectric constant and an interlayer insulating film utilizing a spinner, whereas the present embodiment pertains to the formation of a void using CVD. Specifically, a thin first silicon oxide film 8 is deposited on the metal wires, after which a second silicon oxide film 6 formed along the oxide film is thickly deposited on the tops of the grooves. This oxide 6 which is sequentially deposited causes a void 3 to form automatically between the metal wires. The steps involved in fabricating these semiconductor devices will be described in detail with reference to FIG. 7, which illustrates the first step for this embodiment. The metal wires 2 are patterned onto the insulating film substrate 1, after which the silicon oxide film 8 is thinly deposited by CVD onto the substrate surface. FIG. 8 illustrates the structure obtained when the silicon oxide film 6 is deposited through a second CVD. In the illustrated structure, the silicon oxide is thickly deposited along the upper edges of the grooves between the wires. Thus it is necessary to deposit the oxide film 8 extremely thinly in the grooves so that the leakage current does not increase. The grooves between the wires on the film 8 can be formed so that they are even in order to stabilize the average dielectric constant for the wiring capacitance. In addition, this makes it possible to obtain a uniform film thickness at the bottom of the void. FIG. 9 illustrates the structure obtained when the tops of the grooves are covered by the insulating film 6 because of the sequentially deposited silicon oxide. This covered structure allows the void 3 to form automatically. This is effective in making it possible to reduce the wiring capacitance and to reduce the leakage current which adversely affects the electrical characteristics. FIG. 10 illustrates the structure obtained when the upper metal wiring is formed after forming via contact holes to interconnect the first and second metal wirings. It should be noted that the operational effects of the present invention can of course be obtained even if the CVD selected is a method such as the following: a method wherein monosilane is allowed to react with oxygen; a method wherein $SiF_4$ or $C_2F_6$ is added to ordinary TEOS-CVD so that the silicon oxide is doped with fluorine; or a method wherein CVD is used to deposit a polyimide base insulator.

Figure 11:
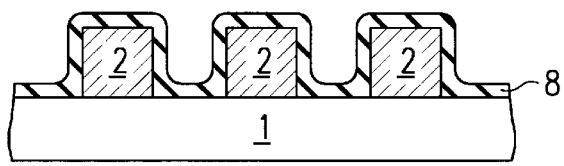
FIG. 11 is a cross section in which the metal wires of another embodiment of the present invention are coated.
Figure 12:
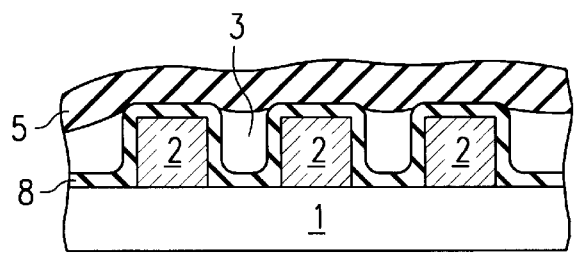
FIG. 12 is a cross section of the major components of the void of another embodiment of the present invention.
Figure 13:
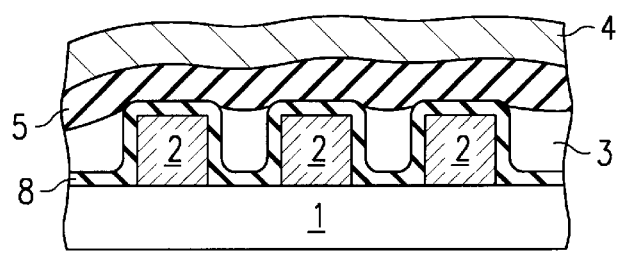
FIG. 13 is a cross section of the major components of semiconductor devices of another embodiment of the present invention.
Figure 14:
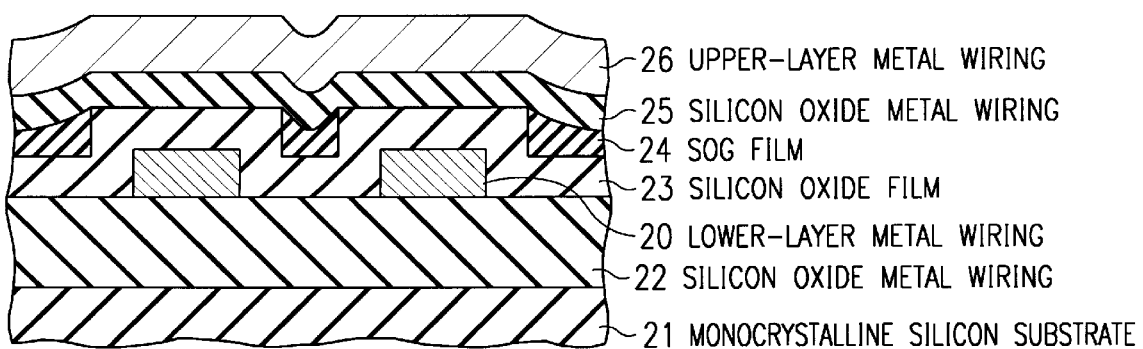
FIG. 14 is a cross section of semiconductor devices with a conventional multilayer wiring structure.

FIG. 11 is a cross section that illustrates the first step for yet another embodiment of the present invention. Specifically, the silicon oxide film 8 is thinly formed by CVD onto the surfaces of the insulating film substrate 1 and the multiple metal wires 2 patterned at a fine pitch onto the insulating film substrate 1. In FIG. 12, a spinner is used to coat the substrate 1 at an angular velocity of 1000 to 5000 rpm using a polyimide precursor 5 with a viscosity sufficient for the formation of a void in the grooves on the insulating film substrate 1. During the spinner step, it is not possible for the polyimide precursor 5 to enter the grooves on the substrate 1 because of the high viscosity of the polyimide. For example, with 64M DRAMs, the metal wire 2 gaps are patterned to 0.04 $\mu$m, while with 256M DRAMs the pitch is 0.025 $\mu$m. Thus, it is sufficiently possible to form a void if the viscosity of the precursor 5 to be used in coating is adjusted. If, however, the wiring density requirements are not strict, a thermally contractive polyimide resin may be used as in the first embodiment described above. In addition, if the metal wiring pitch is large, it is not especially necessary to form a dielectric void. After the spinner coating step is completed, baking at 100° to 150° C. is performed to evaporate the solvent, after which the film 5 is imidized at 200° to 250° C., then cured at 300° to 400° C. FIG. 13 is a cross section of the structure obtained when the upper metal wires 4 are formed after forming via contact holes that serve to electrically connect the first-level metal wires 1 to the second-level metal wires 4. Instead of the polyimide precursor used in the previous embodiment, it is also possible to use a spinner for coating a solvent that contains PTFE, or SOG. In addition, whereas a thermally contractive material was selected for use as the precursor when using a spinner in the previous embodiments, in the present case it is possible to use a precursor with a sufficient viscosity that the insulator, which has a very low thermal contraction value, does not enter the grooves between the wires. This serves to prevent a decrease in the reliability of the interlayer insulating film when the thermal contraction process takes place. More specifically, the insulator precursor contracts toward the center of the insulator when heated. This prevents the occurrence of stress on the upper and lower wiring layers and the film due to the contractive action in the surface direction and due to the reduction in thickness between the upper and lower wiring layers. As a result, it is possible to form a highly reliable insulating film. If the angular velocity of the spinner is increased or if the spinning step is lengthened, a precursor with a high viscosity will make it possible to maintain the flatness of the film better than the steps using the precursor described in the previous embodiment. In addition, even in cases where the pitch of the metal wires is large, the precursor does not enter the grooves. This permits a greater level of freedom in the process.

The foregoing discussion pertained primarily to applications to metal wiring for DRAMs. It should be noted that this is not a restriction; for example, applications may also be made to SRAMSs, EEPROMs, EPROMS, microprocessors, and other semiconductor devices that contain multilayer wiring. In addition, although a silicon oxide film was used as the insulating film in the foregoing embodiments, this is not a restriction; for example, if a silicon nitride film is used as the insulating film, it is possible to further increase reliability because dopant transmission can be prevented.

The benefits obtained using representative examples of the inventions disclosed in this embodiment will now be described in brief.

Specifically, a thin silicon oxide is deposited on the surfaces of the insulating film substrate 1 and the fine-pitch metal wires 2, after which a void with a specific dielectric constant of approximately 1 is formed in the grooves. As a result it is possible to reduce the electrostatic capacitance between these metal wires and to reduce the leakage current as well. More specifically, when CVD or sputtering is used to form a film under conformal conditions on the upper edges of the grooves on the silicon oxide film on the surface of the metal wiring between neighboring wires, the grooves between the neighboring wires make contact before they are filled with the insulating film, thereby allowing the void to form. This makes it possible to reduce the electrostatic capacitance between the wires of semiconductor integrated circuit devices, and to reduce the leakage current. This is beneficial in making it possible to improve the electrical characteristics of integrated circuits, such as their operating speed.

In addition, a spinner can be used instead of CVD to form the interlayer insulating film, in which case the thermal contraction or the viscosity of the precursor during the spinner step is used to form the void between the metal wires. This makes it possible to reduce wiring capacitance as well.

In addition, if the film deposited by CVD, sputtering, etc., has a low dielectric constant, then it is also possible to reduce the capacitance between wires to the left and right and above and below.

The silicon oxide film 8 coated onto the metal wires acts as a surface protective film. This is especially effective for improving reliability, especially during fabrication steps such as sputtering which create pollutants.

We claim:

1. A semiconductor device with multilayer wiring, comprising:
   an insulating substrate;
   a first wiring layer of wires formed on the insulating substrate leaving grooves between the wires which are wider than a width of said wires;
   a contracted, undulating interlayer insulating film covering the wires and spanning the grooves to enclose voids having a width wider than said wires; and
   a second wiring layer of wires formed on the interlayer insulating film;
   whereby the voids enclosed by the undulating interlayer insulating film reduce the capacitance between wires of said first wiring layer.

2. The semiconductor device of claim 1 further comprising:
   a thin insulating film deposited on the wires and grooves of the first wiring layer to reduce the leakage current between wires.

3. The semiconductor device of claim 2 wherein the thin insulating film is a $SiO_2$ film.

4. The semiconductor device of claim 1 wherein the undulating interlayer insulating film comprises a thermally contractive substance.

5. The semiconductor device of claim 1 wherein the undulating interlayer insulating film is a polyimide film.

6. The semiconductor device of claim 1 wherein the undulating interlayer insulating film is an SOG film.

7. The semiconductor device of claim 1 wherein the undulating interlayer insulating film is a PTFE film.

8. The semiconductor device of claim 1 wherein the undulating interlayer insulating film has a specific dielectric constant lower than that of $SiO_2$.

9. The semiconductor device of claim 1 wherein the insulating film comprises a material selected from the group of Teflon, polyimide, silicon oxide containing organic materials, and silicon oxide containing fluorine.

10. A method of making a semiconductor device with low capacitance between wiring layers, comprising the steps of:
    providing a semiconductor substrate;
    forming a first wiring layer of wires on the insulating substrate so as to leave grooves between the wires having a width wider than a width of said wires;
    forming a contracted, undulating interlayer insulating film that covers the wires and spans the grooves to enclose voids having a width wider than a width of said wires; and
    forming a second wiring layer of wires on the interlayer insulating film.

11. The method of claim 10 further comprising the step of:
    before forming the interlayer insulating film, depositing a thin insulating film on the wires and grooves of the first wiring layer to reduce the leakage current between wires.

12. The method of claim 11 wherein the thin insulating film is a $SiO_2$ film.

13. The method of claim 10 wherein the undulating interlayer insulating film comprises a thermally contractive substance.

14. The method of claim 13 wherein the undulating interlayer insulating film is applied to the wires and grooves with a spinner and then baked and cured to induce its contraction from the grooves.

15. The method of claim 10 wherein the undulating interlayer insulating film is a polyimide film.

16. The method of claim 10 wherein the undulating interlayer insulating film is an SOG film.

17. The method claim 10 wherein the undulating interlayer insulating film is a PTFE film.

18. The method of claim 10 wherein the undulating interlayer insulating film has a specific dielectric constant lower than that of $SiO_2$.

* * * * *